US012761274B2

(12) United States Patent
Roh et al.

(10) Patent No.: US 12,761,274 B2
(45) Date of Patent: Oct. 13, 2026

(54) JITTER MEASUREMENT CIRCUIT AND JITTER MEASUREMENT METHOD

(71) Applicant: SAMSUNG ELECTRONICS CO., LTD., Suwon-si (KR)

(72) Inventors: Hyungdong Roh, Suwon-si (KR); Jihun Choi, Seoul-si (KR); Jaedo Kim, Seoul-si (KR); Jeongjin Roh, Seoul-si (KR); Youngjae Cho, Suwon-si (KR); Michael Choi, Suwon-si (KR)

(73) Assignees: SAMSUNG ELECTRONICS CO., LTD., Suwon-si (KR); IUCF-HYU (Industry-University Cooperation Foundation Hanyang University), Seoul (KR)

(*) Notice: Subject to any disclaimer, the term of this patent is extended or adjusted under 35 U.S.C. 154(b) by 209 days.

(21) Appl. No.: 18/823,768

(22) Filed: Sep. 4, 2024

(65) Prior Publication Data

US 2025/0123327 A1 Apr. 17, 2025

(30) Foreign Application Priority Data

Oct. 12, 2023 (KR) ........................ 10-2023-0136220

(51) Int. Cl.
*G01R 31/317* (2006.01)

(52) U.S. Cl.
CPC . *G01R 31/31709* (2013.01); *G01R 31/31703* (2013.01); *G01R 31/31711* (2013.01); *G01R 31/31712* (2013.01)

(58) Field of Classification Search
CPC ...... G01R 31/00; G01R 31/28; G01R 31/317; G01R 31/31703; G01R 31/31708;
(Continued)

(56) References Cited

U.S. PATENT DOCUMENTS 5,109,307 A * 4/1992 Sidman ................ G11B 5/5965
6,683,833 B2 * 1/2004 Dekker ................ G11B 7/0956
(Continued)

FOREIGN PATENT DOCUMENTS

CN 115955247 A 4/2023

OTHER PUBLICATIONS

J. Roh, et al., "A 0.9-V 60 W 1-Bit 4th-Order Delta-Sigma Modulator with 83-dB Dynamic Range", IEEE J. Solid-State Circuits, vol. 43, No. 2, pp. 361-370, 2008.
(Continued)

*Primary Examiner* — Hoai-An D. Nguyen
(74) *Attorney, Agent, or Firm* — Morgan, Lewis & Bockius LLP

(57) ABSTRACT

A jitter measurement circuit for measuring a jitter of an input signal, the jitter measurement circuit including: a multiplexer configured to output a first comparison signal or a second comparison signal in response to an output signal; a detecting circuit configured to output a detection signal corresponding to a phase difference between an output of the multiplexer and the input signal; a first adder configured to sum the detection signal and a feedback signal; an integrating circuit configured to integrate and output an output of the first adder; a feedback circuit configured to trim an output of the integrating circuit to generate the feedback signal; and a comparator configured to generate an output signal by comparing the output of the integrating circuit with a reference potential.

20 Claims, 18 Drawing Sheets

(58) Field of Classification Search
CPC ........ G01R 31/31709; G01R 31/31711; G01R 31/31712; G01R 31/3181; G01R 31/3183; G01R 31/318328
USPC .......................................... 324/600, 612, 613
See application file for complete search history.

(56) References Cited

U.S. PATENT DOCUMENTS

| | | | |
|---|---|---|---|
| 8,144,756 | B2 | 3/2012 | Lee et al. |
| 8,618,967 | B2 | 12/2013 | Nikaeen et al. |
| 8,842,030 | B1 | 9/2014 | Fontaine et al. |
| 9,485,085 | B2 | 11/2016 | Arcudia et al. |
| 9,584,177 | B2 | 2/2017 | Pavlovic et al. |
| 11,025,260 | B1 * | 6/2021 | Chao ........................ H03L 7/093 |
| 11,063,603 | B1 | 7/2021 | Vyas |
| 11,095,293 | B1 | 8/2021 | Sahu et al. |
| 11,606,102 | B2 | 3/2023 | Zhang et al. |
| 2019/0226880 | A1 * | 7/2019 | Raman ................. G01D 18/008 |
| 2021/0345939 | A1 * | 11/2021 | Jumbe ...................... A61B 7/04 |

OTHER PUBLICATIONS

Wei-Zen Chen and Po-I Kuo, "A ΔΣTDC with Sub-ps Resolution for PLL Built-in Phase Noise Measurement", IEEE European Solid-State Circuits Conference, pp. 347-350, 2016.
Mao-Hsuan Chou, et al., "Embedded PLL Phase Noise Measurement Based on a PFD/CP MASH 1-1-1 ΔΣ Time-to-Digital Converter in 7nm CMOS", Symposia on VLSI Technology and Circuit, pp. 1-2, 2020.
Y. Du, T. He, et al., "A Robust NTF Zero Optimization Technique for both Low and High OSRs Sigma-Delta Modulators", IEEE Asia Pacific Conference on Circuit and Systems, pp. 29-32, 2012.

* cited by examiner

10

| CASE | sig_1 | sig_3 | Ceq |
|---|---|---|---|
| 1 | OFF | OFF | $C_1$ |
| 2 | ON | OFF | $C_1 + C_2$ |
| 3 | OFF | ON | $C_1 + C_3$ |
| 4 | ON | ON | $C_1 + C_2 + C_3$ |

TABLE 1

1000

JITTER MEASUREMENT CIRCUIT AND JITTER MEASUREMENT METHOD

CROSS-REFERENCE TO RELATED APPLICATION

This application claims priority under 35 U.S.C. § 119 to Korean Patent Application No. 10-2023-0136220, filed on Oct. 12, 2023, in the Korean Intellectual Property Office, the disclosure of which is incorporated by reference herein in its entirety.

TECHNICAL FIELD

The inventive concept relates to a jitter measurement circuit and a jitter measurement method, and in particular, to a jitter measurement circuit and a jitter measurement method capable of adjusting a measurement frequency region.

DISCUSSION OF RELATED ART

Jitter, which manifests as noise during the operation of an integrated circuit, is a potential cause of data loss and device malfunction. With the advancement of semiconductor technology and the rise in circuit integration, the impact of signal jitter on device performance has increased. Therefore, there is a need for a measurement device that can accurately and efficiently measure the jitter in signals generated by an integrated circuit device and the like.

However, measuring jitter with separate equipment necessitates an increase in the number of semiconductor pins for this task, potentially complicating the circuit and increasing the cost of the measurement equipment.

SUMMARY

The inventive concept provides a circuit capable of adjusting a measurement frequency, thereby reducing the cost required for jitter measurement.

According to an embodiment of the inventive concept, there is provided a jitter measurement circuit for measuring a jitter of an input signal, the jitter measurement circuit including: a multiplexer configured to output a first comparison signal or a second comparison signal in response to an output signal; a detecting circuit configured to output a detection signal corresponding to a phase difference between an output of the multiplexer and the input signal; a first adder configured to sum the detection signal and a feedback signal; an integrating circuit configured to integrate and output an output of the first adder; a feedback circuit configured to trim an output of the integrating circuit to generate the feedback signal; and a comparator configured to generate an output signal by comparing the output of the integrating circuit with a reference potential.

According to an embodiment of the inventive concept, there is provided a jitter measurement circuit for measuring a jitter of an input signal, the jitter measurement circuit including: a multiplexer configured to select and output one of a first comparison signal and a second comparison signal based on an output signal; a detecting circuit configured to output a detection signal corresponding to a phase difference between the output of the multiplexer and the input signal; an integrating circuit including a first input terminal, a second input terminal, a first output terminal and a second output terminal, and configured to amplify signals received through the first input terminal and the second input terminal and output amplified signals to the first output terminal and the second output terminal; a feedback circuit including a first variable capacitor connected between the first output terminal and the first input terminal and a second variable capacitor connected between the second output terminal and the second input terminal; and a comparing circuit configured to compare the signal output to the first output terminal and the signal output to the second output terminal with a reference potential to output the output signal based on a result of the comparison.

According to an embodiment of the inventive concept, there is provided a jitter measurement method of measuring a jitter of an input signal, the jitter measurement method including: selecting one of a first comparison signal and a second comparison signal, which are clock signals, in response to an output signal; outputting a detection signal corresponding to a phase difference between the input signal and the selected one of the first comparison signal and the second comparison signal; outputting a first internal signal by summing the detection signal and a feedback signal; outputting a second internal signal by integrating the first internal signal; generating the feedback signal by trimming the second internal signal; and generating the output signal by comparing the second internal signal with a reference potential.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1:
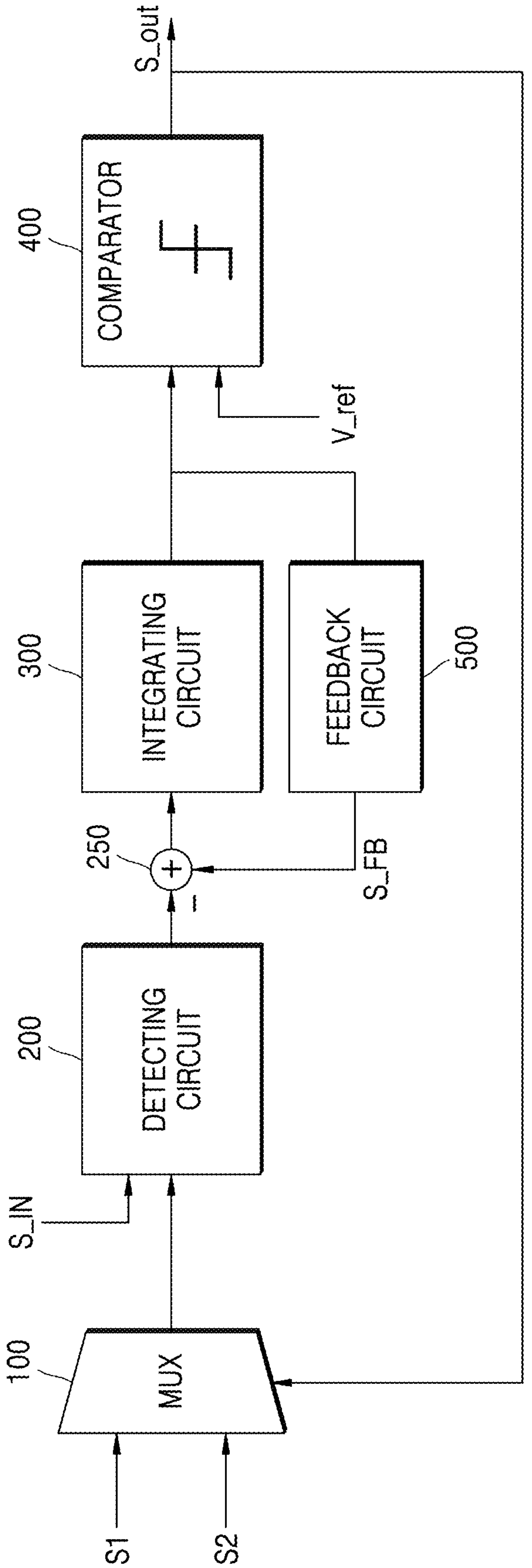
FIG. 1 is a block diagram illustrating a jitter measurement circuit according to an embodiment.

FIG. 1 is a block diagram schematically illustrating a jitter measurement circuit according to an embodiment.

Referring to FIG. 1, a jitter measurement circuit 10 may be implemented using a delta-sigma modulator. The jitter measurement circuit 10 may convert a phase difference of clock signals, which include timing information, into a digital signal and output a result of the conversion as an output signal S_out. As shown in FIG. 1, the jitter measurement circuit 10 may include a multiplexer 100, a detecting circuit 200, a first adder 250, an integrating circuit 300, a comparator 400, and a feedback circuit 500.

The multiplexer 100 may select and output one of a first comparison signal S1 and a second comparison signal S2. In some embodiments, the multiplexer 100 may perform a multiplexing operation for selecting one of the first comparison signal S1 and the second comparison signal S2 based on the output signal S_out that is the output of the comparator 400. The first comparison signal S1 and the second comparison signal S2 may be signals based on a clean reference signal that does not include a noise component or the like. For example, the first comparison signal S1 and the second comparison signal S2 may be signals that are obtained by adding or subtracting a specific phase value to or from the reference signal. The multiplexer 100 outputs the first comparison signal S1 or the second comparison signal S2 and provides the same to the detecting circuit 200 so that the first comparison signal S1 or the second comparison signal S2 is compared to an input signal S_IN.

The detecting circuit 200 may receive an output of the multiplexer 100 and the input signal S_IN. The input signal S_IN may include noise. The detecting circuit 200 may detect a phase difference by comparing the phase of the first comparison signal S1 or the second comparison signal S2 output from the multiplexer 100 with the phase of the input signal S_IN, based on the reference signal. For example, the detecting circuit 200 may output a detection signal (for example, a voltage) corresponding to a phase difference between the output of the multiplexer 100 and the input signal S_IN.

The first adder 250 may add the output of the detecting circuit 200 to a feedback signal S_FB and output the added result. For example, as will be described later, the feedback signal S_FB may be a signal trimmed by the feedback circuit 500. The first adder 250 sums the detection signal and the feedback signal S_FB and provides the sum of the detection signal and the feedback signal S_FB to the integrating circuit 300, thereby enabling the adjustment of the frequency region within which the jitter is measured. For example, as will be described later with reference to FIG. 7, the first adder 250 provides the integrating circuit 300 with a feedback coefficient appropriately adjusted by the feedback circuit 500, thereby enabling the expansion of the frequency region within which the jitter is measured.

The integrating circuit 300 may perform an integration operation by receiving the output of the first adder 250. The order of the integrating circuit 300 may be variously implemented. In other words, the integrating circuit 300 may include at least one integrator. For example, the integrating circuit 300 may include an amplifier (e.g., an OP-AMP), and may integrate the output of the first adder 250. The integrating circuit 300 may operate as a high pass filter, and for example, may operate as a high pass filter for filtering out noise components or quantization error components. The output of the integrating circuit 300 may be provided to the feedback circuit 500 and/or the comparator 400.

The feedback circuit 500 may receive the output of the integrating circuit 300 and output the feedback signal S_FB. The feedback signal S_FB may be a signal in which the output of the integrating circuit 300 is trimmed by the feedback circuit 500. The feedback signal S_FB may be provided to the first adder 250. Since the feedback signal S_FB is added to the output of the detecting circuit 200 by the first adder 250, the trimming result of the feedback circuit 500 may be reflected, and thus, the measurable frequency region may be adjusted as described later. In some embodiments, the specific trimming control of the feedback circuit 500 may be variously implemented to appropriately respond to various situations, and the feedback circuit 500 may provide various feedback signals S_FB to the first adder 250 depending on a particular situation or purpose.

The comparator 400 may compare the output of the integrating circuit 300 with a reference potential V_ref and may output the output signal S_out. The output of the integrating circuit 300 may be an analog signal including various potentials, and the comparator 400 may compare the analog signal, which is the output of the integrating circuit 300, with the reference potential V_ref. The comparator 400 may compare the output of the integrating circuit 300 with the reference potential V_ref according to a clock signal (e.g., a reference signal). In this case, the comparator 400 may output a logic high level when the output of the integrating circuit 300 is greater than the reference potential V_ref, and output a logic low level when the output of the integrating circuit 300 is less than the reference potential V_ref. In this way, the comparator 400 may receive the output of the integrating circuit 300 and output the same as a digital signal having a value of “1” or “0”. Accordingly, the comparator 400 may function as a quantizer. The output signal S_out of the comparator 400 may be provided to the multiplexer 100 as described above.

As a result, the jitter measurement circuit according to the embodiment may function as a time-to-digital converter (TDC), and since the jitter component of the input signal S_IN may be measured, the complexity of the circuit may be reduced and the jitter measurement operation may be performed at low cost.

In addition, the jitter measurement circuit according to an embodiment includes, in the circuit, a feedback loop that trims the output result of the integrating circuit and provides the same as input again, so that the frequency region for measuring jitter may be adjusted by the adjustment of a feedback coefficient. Accordingly, the jitter measurement circuit according to an embodiment may expand a measurable frequency range, and thus, may perform a test more efficiently.

Figure 2:
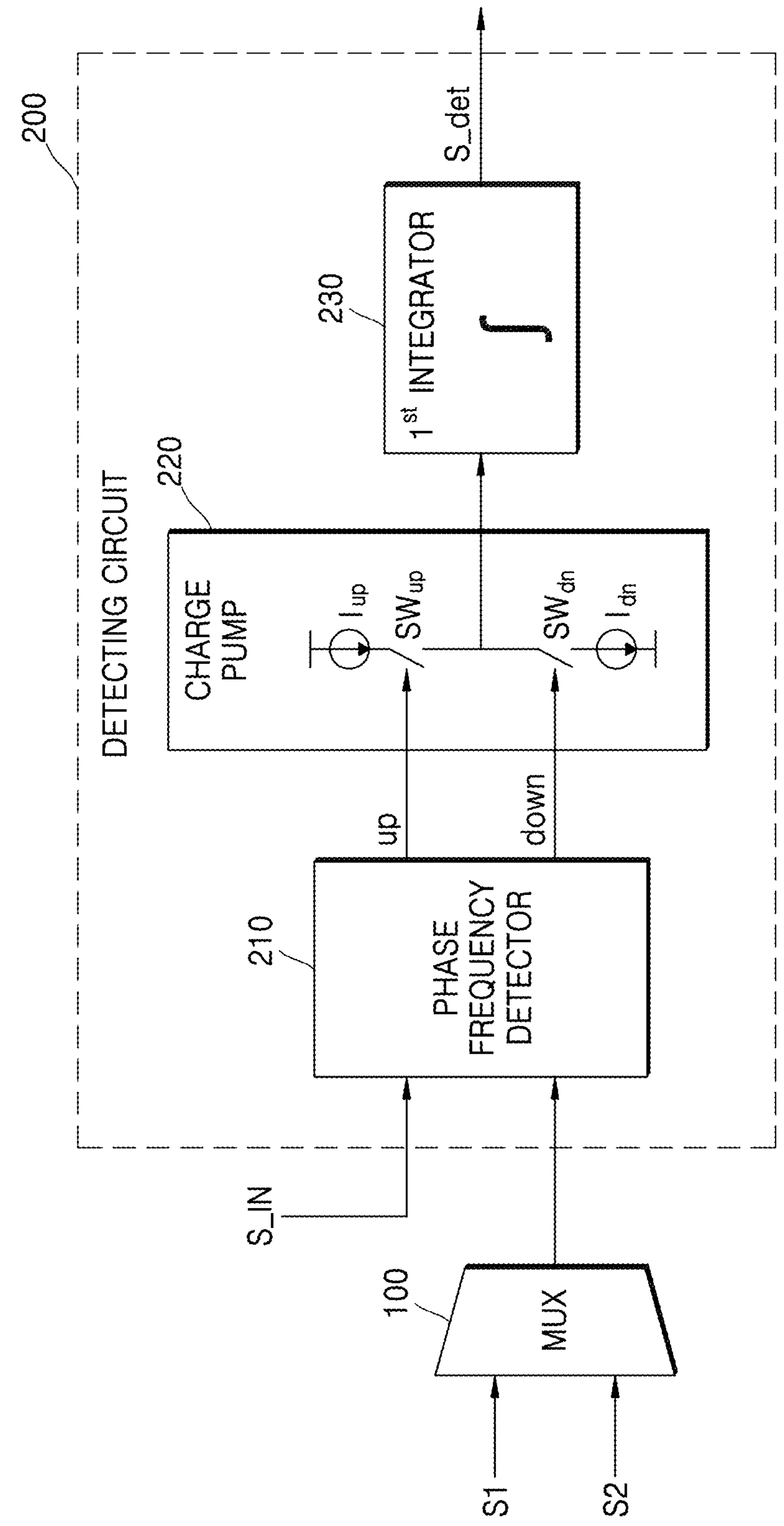
FIG. 2 is a block diagram illustrating a detecting circuit according to an embodiment.

FIG. 2 is a block diagram illustrating a detecting circuit according to an embodiment.

Referring to FIG. 2, the detecting circuit 200 may include a phase frequency detector (PFD) 210, a charge pump 220, and a first integrator 230. The detecting circuit 200 may output a detection signal S_det by detecting a phase difference between signals.

The phase frequency detector 210 may receive an input signal S_IN and an output of the multiplexer 100. As described above with reference to FIG. 1, the output of the multiplexer 100 may be a value obtained by adding or subtracting a specific phase value to or from a clean reference signal that does not include a noise component or the like. In some embodiments, the phase frequency detector 210 may compare the input signal S_IN with the output of the multiplexer 100 to detect a phase difference between the two signals. In some embodiments, the phase frequency detector 210 may output a signal corresponding to the detected phase difference. More specifically, a signal for controlling a switch, which controls current generation in the charge pump 220, may be output from the phase frequency detector 210. For example, when the phase difference between the two signals received by the phase frequency detector 210 is positive, an up signal may be output from the phase frequency detector 210 to supply electric charges to the first integrator 230. In addition, when the phase difference between the two signals received by the phase frequency detector 210 is negative, a down signal may be output from the phase frequency detector 210 to draw electric charges from the first integrator 230. The up signal and the down signal may be provided to the charge pump 220.

The charge pump 220 may include a first current source $I_{up}$, a first current switch $SW_{up}$, a second current source $I_{dn}$, and a second current switch $SW_{dn}$. The first current source $I_{up}$ may be connected in series to the first current switch $SW_{up}$, and the second current source Ian may be connected in series to the second current switch $SW_{dn}$.

The charge pump 220 may generate a current by receiving the outputs of the phase frequency detector 210. The first current switch $SW_{up}$ may be switched according to the switching signal up. For example, when the switching signal up that is output from the phase frequency detector 210 is at a logic high level, the first current switch $SW_{up}$ may be turned on to provide the current generated by the first current source $I_{up}$ to the first integrator 230, and thus, a charge may be supplied from the charge pump 220 to the first integrator 230. Alternatively, for example, when the switching signal down that is output from the phase frequency detector 210 is at a logic high level, the second current switch $SW_{dn}$ may be turned on to draw the current generated by the second current source $I_{dn}$ and the amount of charge received by the first integrator 230 may be reduced. In other words, when the phase difference between the output of the multiplexer 100 and the input signal S_IN is positive, the charge pump 220 may increase the amount of charge provided to the first integrator 230, and when the phase difference between the output of the multiplexer 100 and the input signal S_IN is negative, the charge pump 220 may decrease the amount of charge provided to the first integrator 230.

The first integrator 230 may output the detection signal S_det by receiving and integrating current (or charges) generated by the charge pump 220. In some embodiments, the first integrator 230 may include a capacitor, and the detection signal S_det output by the first integrator 230 may be adjusted by charging or discharging charges supplied from the charge pump 220 to or from the capacitor. For example, when the phase difference between the output of the multiplexer 100 and the input signal S_IN is positive, the amount of charge received by the first integrator 230 may increase, and the voltage magnitude of the detection signal S_det may increase. Alternatively, when the phase difference between the output of the multiplexer 100 and the input signal S_IN is negative, the amount of charge received by the first integrator 230 may be reduced, and the voltage magnitude of the detection signal S_det may be reduced.

As a result, the jitter measurement circuit according to the embodiment may detect, through the detecting circuit 200, a jitter component due to noise included in the input signal S_IN and output a corresponding signal (e.g., voltage).

Figure 3:
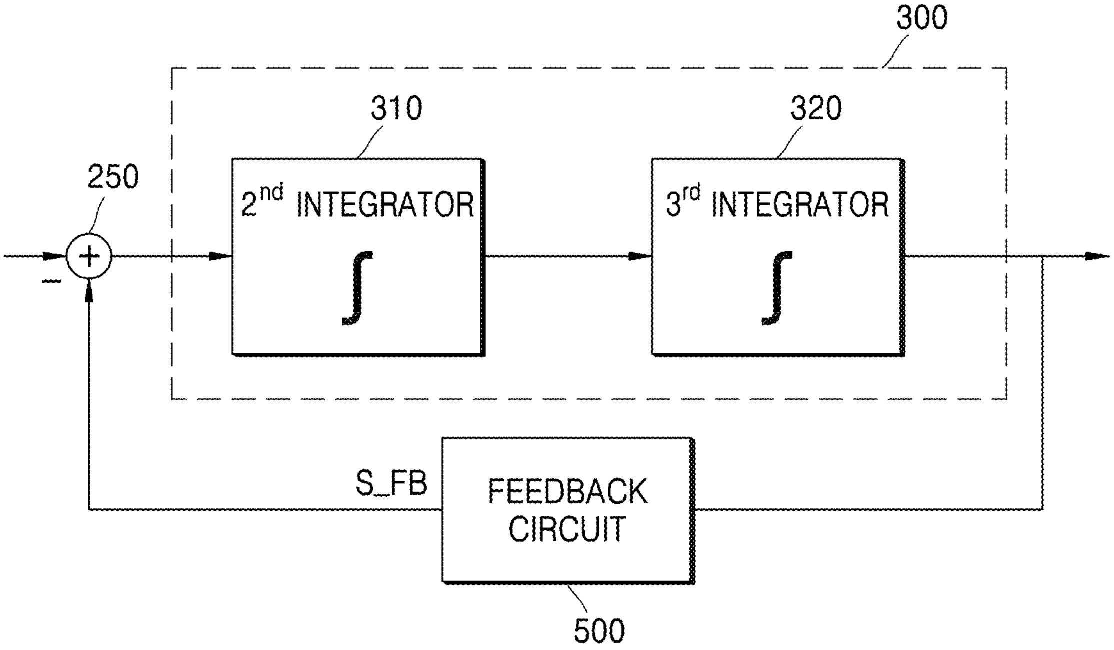
FIG. 3 is a block diagram illustrating an example of an integrating circuit according to an embodiment.

FIG. 3 is a block diagram illustrating an example of an integrating circuit according to an embodiment.

Referring to FIG. 3, the integrating circuit 300 may include a second integrator 310 and a third integrator 320. The second integrator 310 may integrate the output of the first adder 250 and provide the result of the integration to the third integrator 320. In addition, the third integrator 320 may integrate the output of the second integrator 310 and output the result of the integration. In some embodiments, the second integrator 310 and the third integrator 320 may each be implemented as a first-order integrator. As described above, the first adder 250 may provide, to the second integrator 310, a signal obtained by summing the signal corresponding to the phase difference (e.g., the detection signal) and the feedback signal S_FB. In this case, the second integrator 310 may operate as a high pass filter for filtering out a noise component or a quantization error component. Similarly, the third integrator 320 may operate as a high pass filter for filtering out a noise component or a quantization error component included in the output of the second integrator 310. The feedback circuit 500 may receive the output of the third integrator 320 to perform a trimming operation, and may generate a feedback signal S_FB as a result of the trimming operation. As will be described later with reference to FIG. 7, the specific trimming operation of the feedback circuit 500 may be implemented in various ways depending on the types of the integrators (e.g., the second integrator 310 and the third integrator 320) included in the integrating circuit 300.

As a result, the integrating circuit 300 according to an embodiment may increase an integration order by including the second integrator 310 and the third integrator 320, and may improve the noise shaping performance of the jitter measurement circuit according to an embodiment. The order of the integrating circuit 300 is not limited to the present embodiment and may be variously implemented.

Figure 4:
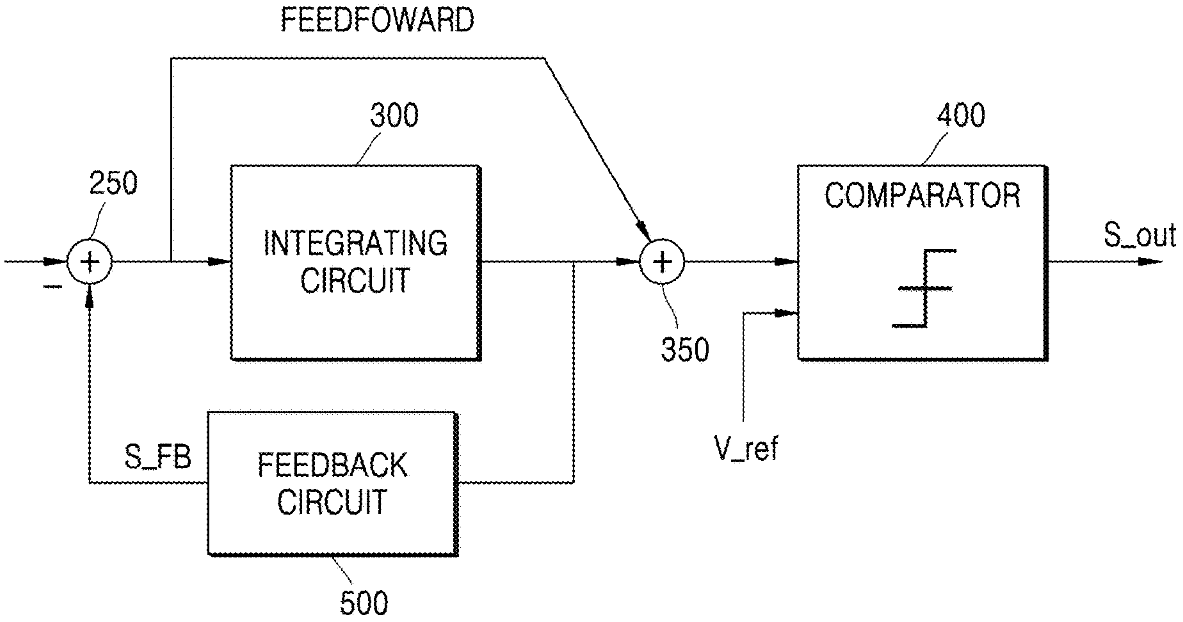
FIG. 4 is a block diagram illustrating a feedforward structure according to an embodiment.

FIG. 4 is a block diagram illustrating a feedforward structure according to an embodiment.

Referring to FIG. 4, the jitter measurement circuit according to an embodiment may further include a second adder 350, and may have a feedforward structure through the second adder 350. The second adder 350 may receive an output of the integrating circuit 300 and an output of the first adder 250. The output of the first adder 250 may be a signal that includes a feedback signal S_FB, where the output of the integrating circuit 300 is trimmed by the feedback circuit 500. The second adder 350 may sum the output of the integrating circuit 300 and the output of the first adder 250 and provide the summed result to the comparator 400. The comparator 400 may receive the output of the second adder 350 and compare that with the reference potential V_ref, and output an output signal S_out having a logic high level or a logic low level by comparing the two signals according to the clock signal as described above. As a result, since the jitter measurement circuit according to an embodiment has a feedforward structure in which the output of the first adder 250 including the feedback signal S_FB is summed with the output of the integrating circuit 300 through the second adder 350 and the summed result is provided to the comparator 400, an output swing is reduced. Therefore, the requirements for integrator design in terms of voltage headroom and slew rate may be alleviated.

Figure 5:
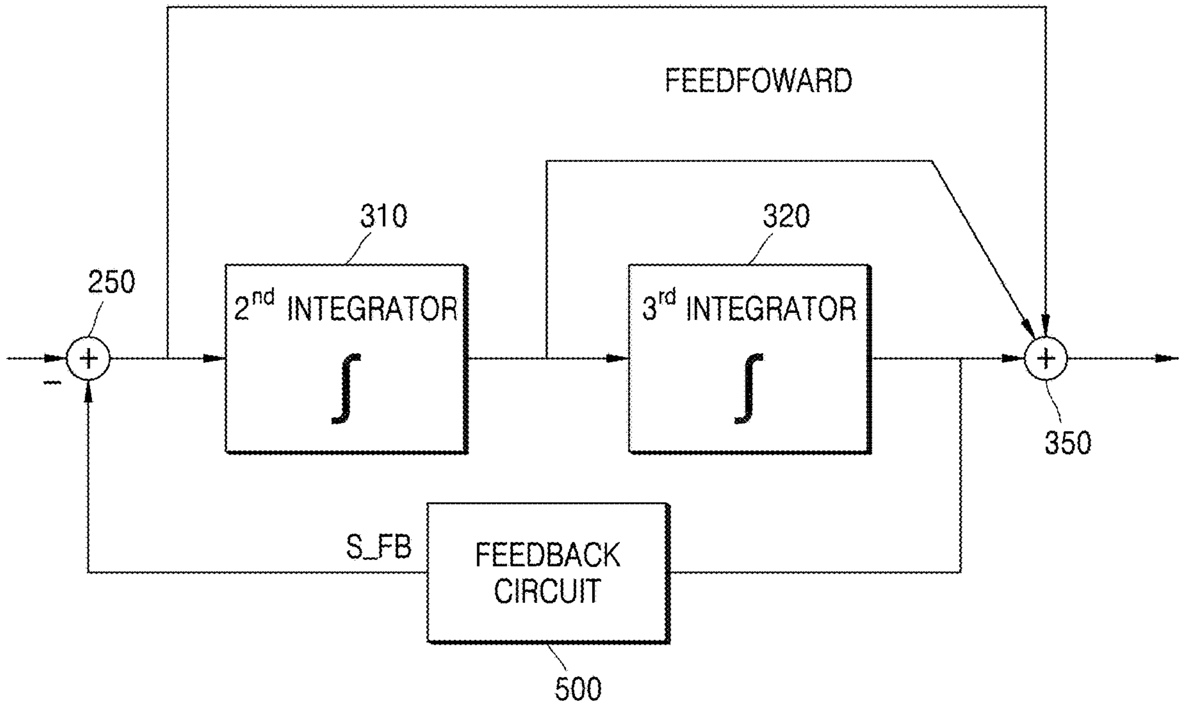
FIG. 5 is a block diagram illustrating a cascade-of-integrators-feedforward (CIFF) structure according to an embodiment.

FIG. 5 is a block diagram illustrating a cascade-of-integrators-feedforward (CIFF) structure according to an embodiment.

As described above with reference to FIG. 3, the integrating circuit 300 may include the second integrator 310 and the third integrator 320, and each of the second integrator 310 and the third integrator 320 may operate as a high pass filter for filtering out a noise component or a quantization error component. Referring to FIG. 5, the jitter measurement circuit according to an embodiment may further include a second adder 350, and the second adder 350 may receive and sum the output of the first adder 250 including the feedback signal S_FB trimmed by the feedback circuit 500, the output of the second integrator 310, and the output of the third integrator 320. In other words, a CIFF structure may be implemented in which a signal including a feedback component and an output of each of the integrators are summed.

Since the jitter measurement circuit according to an embodiment may have a CIFF structure through the second adder 350 and thus reduce the output swing of each integrator, the design constraints for each integrator may be relaxed.

Figure 6:
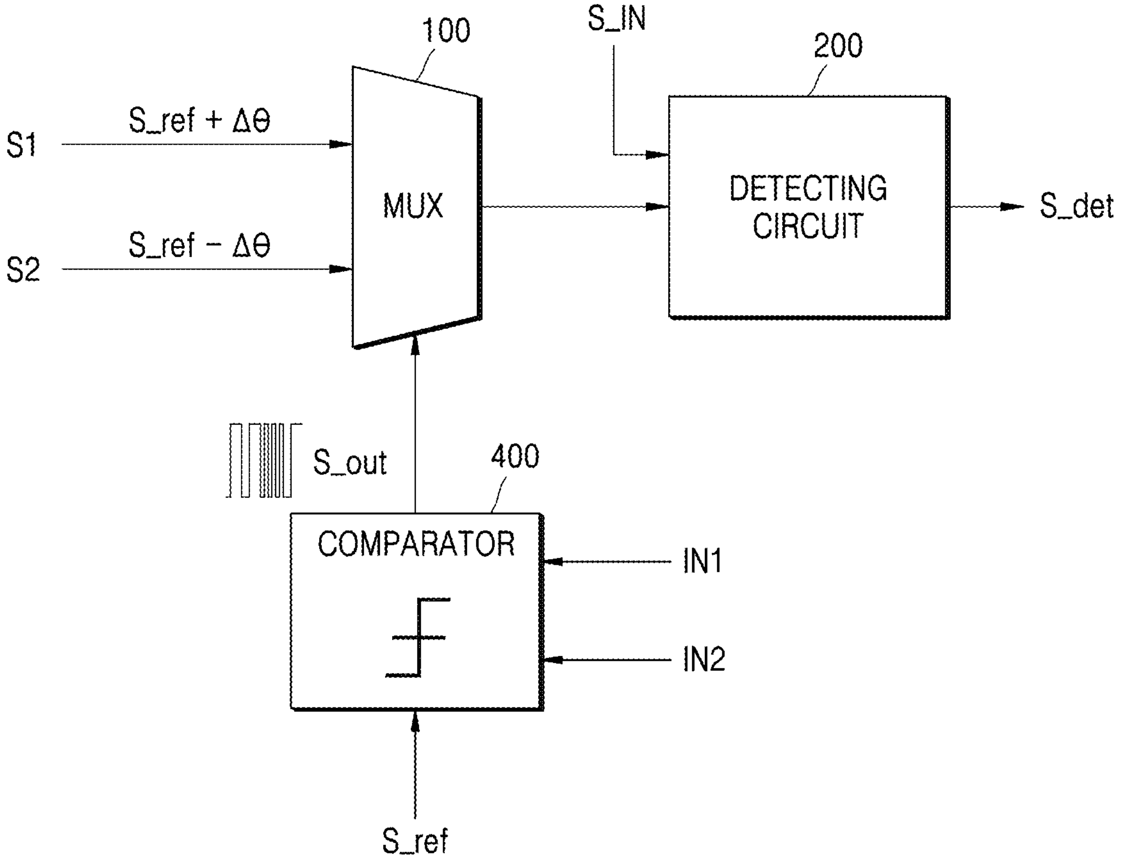
FIG. 6 is a block diagram illustrating phase difference detection according to an output signal according to an embodiment.

FIG. 6 is a block diagram illustrating phase difference detection according to an output signal according to an embodiment.

Referring to FIG. 6, the multiplexer 100 may select one of the first comparison signal S1 and the second comparison signal S2 based on the output signal S_out and output the selected signal to the detecting circuit 200. The comparator 400 may provide the output signal S_out having a logic high level or a logic low level to the multiplexer 100, and the multiplexer 100 may output a signal corresponding to a logic high level or a logic low level among the first comparison signal S1 and the second comparison signal S2.

The comparator 400 may perform a comparison operation by receiving a first comparison input IN1 and a second comparison input IN2. For example, as described above with reference to FIGS. 3 and 4, the first comparison input IN1 is the output of the integrating circuit 300 (e.g., the output of the third integrator 320) or the output of the second adder 350. The second comparison input IN2 may be a reference potential V_ref. In some embodiments, the comparator 400 may compare the first comparison input IN1 with the second comparison input IN2 according to a reference signal S_ref, which is a clean signal that does not include a noise component or the like. For example, the comparator 400 may output a logic high level when the output of the integrating circuit 300 has a potential higher than the reference potential V_ref. The comparator 400 may output a logic low level when the output of the integrating circuit 300 has a potential lower than the reference potential V_ref.

In some embodiments, the first comparison signal S1 may have a phase obtained by adding a specific phase value Δθ to the phase of the reference signal S_ref. The second comparison signal S2 may have a phase obtained by subtracting a specific phase value Δθ from the phase of the reference signal S_ref. The multiplexer 100 may perform a multiplexing operation according to a value of the output signal S_out output according to the reference signal S_ref. For example, when the value of the output signal S_out is a logic high level, the first comparison signal S1 may be selected, and thus, the detecting circuit 200 may detect a difference between the phase of the input signal S_IN and the phase obtained by adding the specific phase value Δθ to the phase of the reference signal S_ref. When the value of the output signal S_out is a logic low level, the second comparison signal S2 may be selected, and thus, the detecting circuit 200 may detect a difference between the phase of the input signal S_IN and the phase obtained by subtracting the specific phase value Δθ from the phase of the reference signal S_ref. The detecting circuit 200 may output the detection signal S_det corresponding to the phase difference.

As a result, the jitter measurement circuit according to the embodiment may provide the output signal S_out to the multiplexer 100 in synchronization with the reference signal S_ref, and may perform a jitter measurement operation by synchronizing a multiplexing operation, which detects a phase difference cause by noise in the input signal S_IN, with the output signal S_out.

Figure 7:
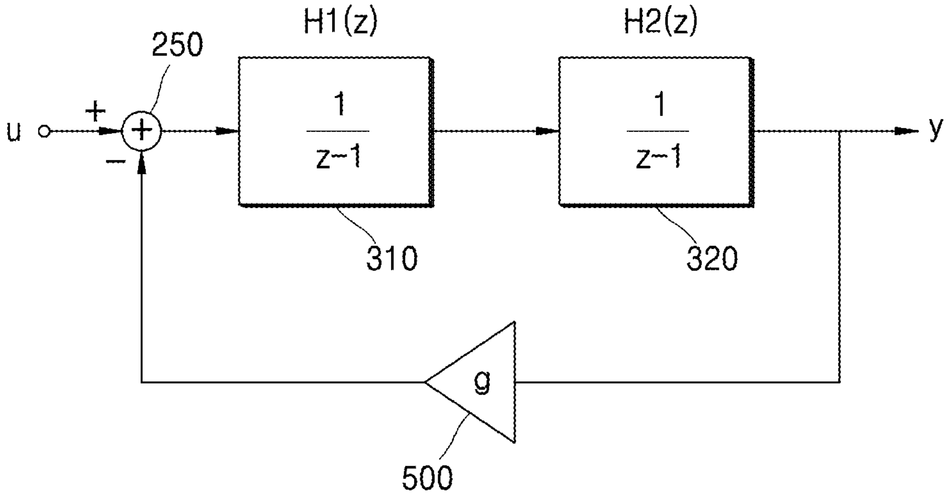
FIG. 7 is a block diagram for designing a feedback circuit according to an embodiment.

FIG. 7 is a block diagram for designing a feedback circuit according to an embodiment.

Referring to FIGS. 3 and 7, the jitter measurement circuit according to an embodiment may adjust a jitter measurement frequency region by adjusting a feedback coefficient g of the feedback circuit 500. Referring to FIG. 3, the transfer function of the second integrator 310 may be expressed as H1($z$), and the transfer function of the third integrator 320 may be expressed as H2($z$). H1($z$) may be represented by $$\frac{1}{z-1}$$

and H2($z$) may be represented by $$\frac{1}{z-1}.$$

The transfer function of the output y for the input u in which the feedback coefficient g is reflected by the first adder 250 may be expressed as Equation 1.

$$\frac{y}{u} = \frac{1}{z^2 - 2z + (1+g)} \quad \text{[Equation 1]}$$

Based on Equation 1, the frequency fzero corresponding to the pole of the transfer function of the output y to the input u is expressed as the sampling frequency fs as in Equation 2.

$$f_{zero} = \frac{f_s}{2\pi}\sqrt{g} \quad \text{[Equation 2]}$$

In some embodiments, the feedback coefficient g may be adjusted by the capacitor included in the feedback circuit 500, and thus, the frequency fzero may be adjusted by adjusting the capacitance of the capacitor. As will be described later, the capacitor of the feedback circuit 500 may be variously implemented. The transfer function of each integrator is not limited to the present embodiment and may be variously implemented based on the configuration of the integrators. Accordingly, the frequency fzero and the capacitance used to determine the feedback coefficient g may be variously determined through the above process.

As a result, the jitter measurement circuit according to the embodiment may control the feedback circuit 500 to set various frequency regions in which jitter may be measured, thereby enabling an efficient jitter measurement to be performed at a lower cost.

Figure 8A:
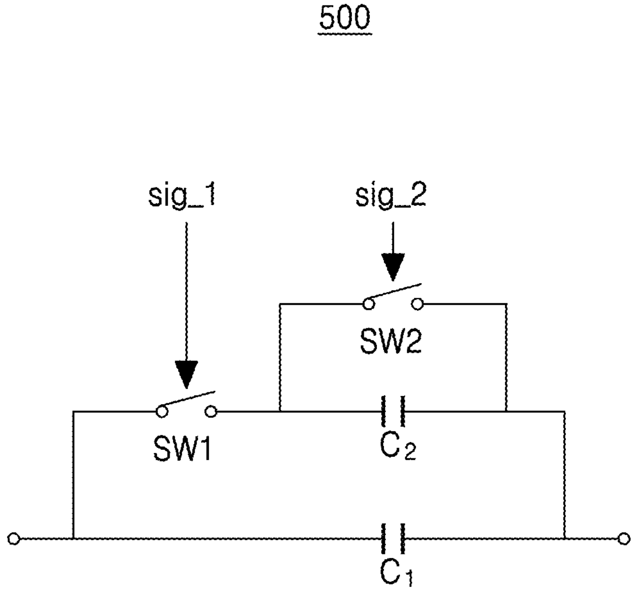
FIG. 8A is a circuit diagram illustrating an example of a feedback circuit according to an embodiment.

FIG. 8A is a circuit diagram illustrating an example of a feedback circuit according to an embodiment.

Referring to FIG. 8A, the feedback circuit 500 may include a first capacitor $C_1$, a second capacitor $C_2$, a first switch SW1, and a second switch SW2. The first switch SW1 may receive a first switching signal sig_1, and the second switch SW2 may receive a second switching signal sig_2. The first switch SW1 may be connected in series with the second capacitor $C_2$, and the second switch SW2 may be connected in parallel with the second capacitor $C_2$. The equivalent capacitance of the feedback circuit 500, e.g., the trimming capacitance, may be adjusted through the control of the first switching signal sig_1 and the second switching signal sig_2. For example, when the first switching signal sig_1 has a logic high level, the first switch SW1 may be turned on, and when the second switching signal sig_2 has a logic low level, the second switch SW2 may be turned off. In this case, the capacitance of the feedback circuit 500 is a sum of the capacitance of the first capacitor $C_1$ and the capacitance of the second capacitor $C_2$. When the first switching signal sig_1 has a logic low level, the capacitance of the feedback circuit 500 becomes the capacitance of the first capacitor $C_1$. As such, the jitter measurement circuit according to the embodiment may control the feedback circuit 500 to adjust the equivalent capacitance, and accordingly, the jitter measurement frequency region may be adjusted.

Figure 8B:
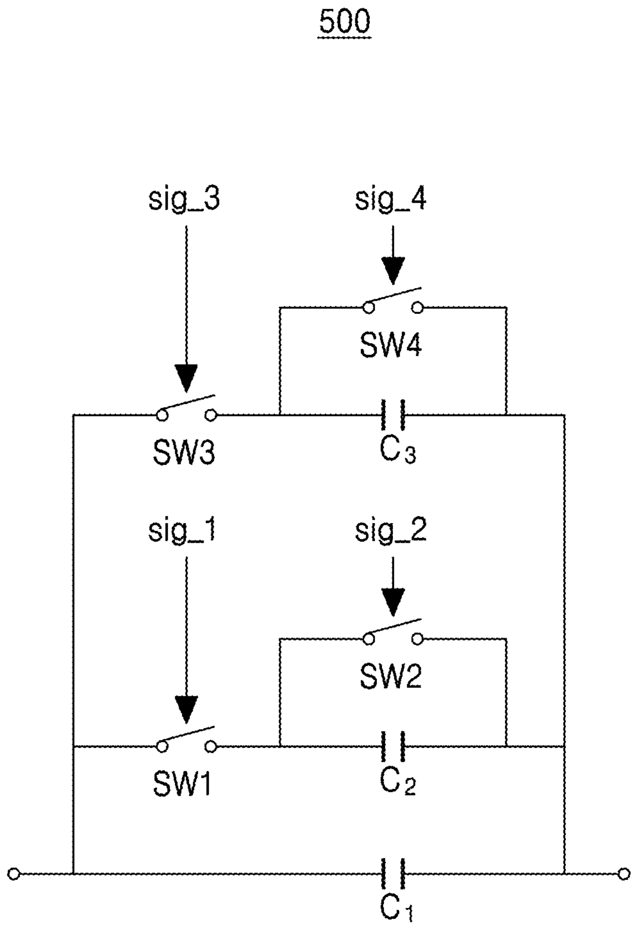
FIG. 8B is a circuit diagram illustrating another example of a feedback circuit according to an embodiment.

FIG. 8B is a circuit diagram illustrating another example of a feedback circuit according to an embodiment.

Referring to FIG. 8B, the feedback circuit 500 may include a first capacitor $C_1$, a second capacitor $C_2$, a third capacitor $C_3$, a first switch SW1, a second switch SW2, a third switch SW3, and a fourth switch SW4. The first to fourth switches SW1 to SW4 may receive a first switching signal sig_1, a second switching signal sig_2, a third switching signal sig_3 and a fourth switching signal sig_4, respectively. The first switch SW1 may be connected in series with the second capacitor $C_2$, the second switch SW2 may be connected in parallel with the second capacitor $C_2$, the third switch SW3 may be connected in series with the third capacitor $C_3$, and the fourth switch SW4 may be connected in parallel with the third capacitor $C_3$. For example, when the first switching signal sig_1 and the third switching signal sig_3 each have a logic high level, the first switch SW1 and the third switch SW3 may be turned on, and when the second switching signal sig_2 and the fourth switching signal sig_4 each have a logic low level, the second switch SW2 and the fourth switch SW4 may be turned off. In this case, the capacitance of the feedback circuit 500 is a sum of capacitances of the first to third capacitors $C_1$ to $C_3$. When each of the first and third switching signals sig_1 and sig_3 is at a logic low level, the capacitance of the feedback circuit 500 becomes the capacitance of the first capacitor $C_1$. As such, the jitter measurement circuit according to the embodiment may variously adjust the equivalent capacitance by implementing one or more capacitors included in the feedback circuit 500 in various ways, and accordingly, the jitter measurement frequency region may be adjusted to suit various situations.

Figure 9:
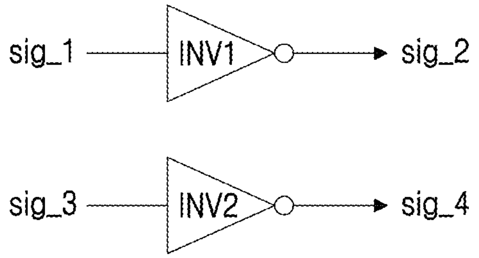
FIG. 9 illustrates diagrams and a table for explaining an example of controlling the feedback circuit of FIG. 8B.

FIG. 9 illustrates diagrams and a table for explaining an example of controlling the feedback circuit of FIG. 8B.

Referring to FIGS. 8B and 9, the first switching signal sig_1 to the fourth switching signal sig_4 for controlling the feedback circuit 500 may be variously configured. For example, when the second capacitor $C_2$ and the third capacitor $C_3$ are connected in parallel to the first capacitor $C_1$, the equivalent capacitance is determined, so that the first to fourth switches SW1 to SW4 may be complementarily controlled without having to control each of the first to fourth switches SW1 and SW4. For example, the second switching signal sig_2 may consist of a signal in which the first switching signal sig_1 is inverted by a first inverter INV1, and the fourth switching signal sig_4 may consist of a signal in which the third switching signal sig_3 is inverted by a second inverter INV2. For example, by allowing the first switch SW1 to complementarily operate with the second switch SW2, and the third switch SW3 to complementarily operate with the fourth switch SW4, all equivalent capacitance values that the feedback circuit 500 can possess may be implemented as shown in Table 1.

For example, the jitter measurement circuit according to the embodiment can achieve a variety of equivalent capacitance values through inclusion of multiple capacitors in the feedback circuit 500. In other words, the jitter measurement circuit according to the embodiment may secure a wider and diverse jitter measurement frequency region, and furthermore, the complexity of design and control may be simplified by making the switches operate complementarily.

Figure 10A:
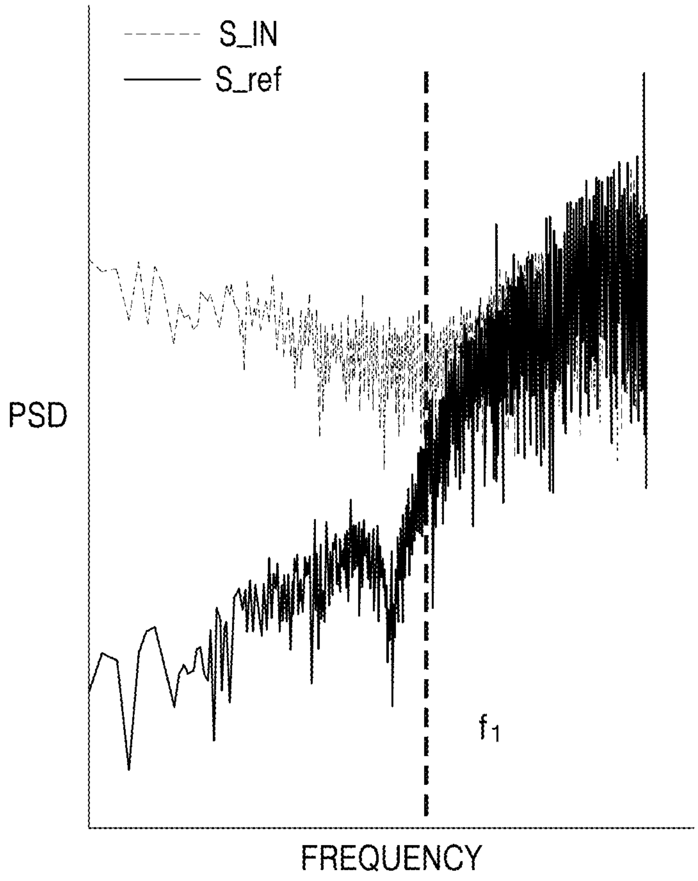
FIGS. 10A and 10B are graphs for comparing Fast Fourier Transform (FFT) of outputs of a jitter measurement circuit according to an embodiment.
Figure 10B:
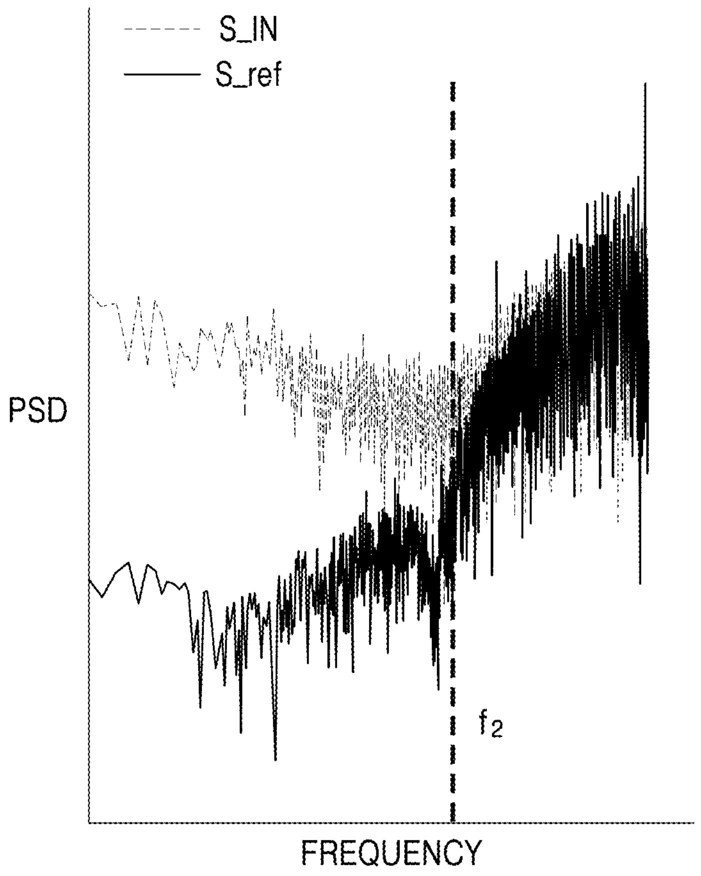

FIGS. 10A and 10B are graphs for comparing Fast Fourier Transform (FFT) of outputs of a jitter measurement circuit according to an embodiment.

Referring to FIGS. 1, 10A, and 10B, Power Spectral Density (PSD) waveform graphs obtained by performing fast Fourier transform (FFT) of an output signal S_out may be compared with each other. A frequency at a point where the FFT waveform of an input signal S_IN including components such as noise meets the FFT waveform of a reference signal S_ref, which is a clean signal, is a maximum frequency range in which jitter may be measured. By adjusting a pole through a feedback loop according to an embodiment, the point where the FFT waveform of the input signal S_IN and the FFT waveform of the reference signal S_ref meet may be shifted to the right. By shifting the point where the FFT waveform of the input signal S_IN and the FFT waveform of the reference signal S_ref meet to the right, a frequency range in which jitter may be measured may be expanded, and a maximum frequency may be also increased.

Referring to FIG. 10A, the illustrated FFT waveform represents a case in which a frequency region adjustment function according to an embodiment is not implemented. A frequency $f_1$, which is a frequency at which the FFT waveform of the input signal S_IN and the FFT waveform of the reference signal S_ref meet, becomes the maximum frequency at which jitter measurement may be performed. However, referring to FIG. 10B, the illustrated FFT waveform represents a case where a frequency region control function according to an embodiment is implemented (e.g., a feedback circuit is implemented). A frequency $f_2$, which is a frequency at which the FFT waveform of the input signal S_IN and the FFT waveform of the reference signal S_REF meet, becomes the maximum frequency at which jitter may be measured. Here, it can be seen that the measurable frequency is increased from $f_1$ to $f_2$. In other words, in the jitter measurement circuit according to an embodiment, a frequency range in which jitter may be measured may be expanded, and a maximum frequency may be also increased.

Figure 11:
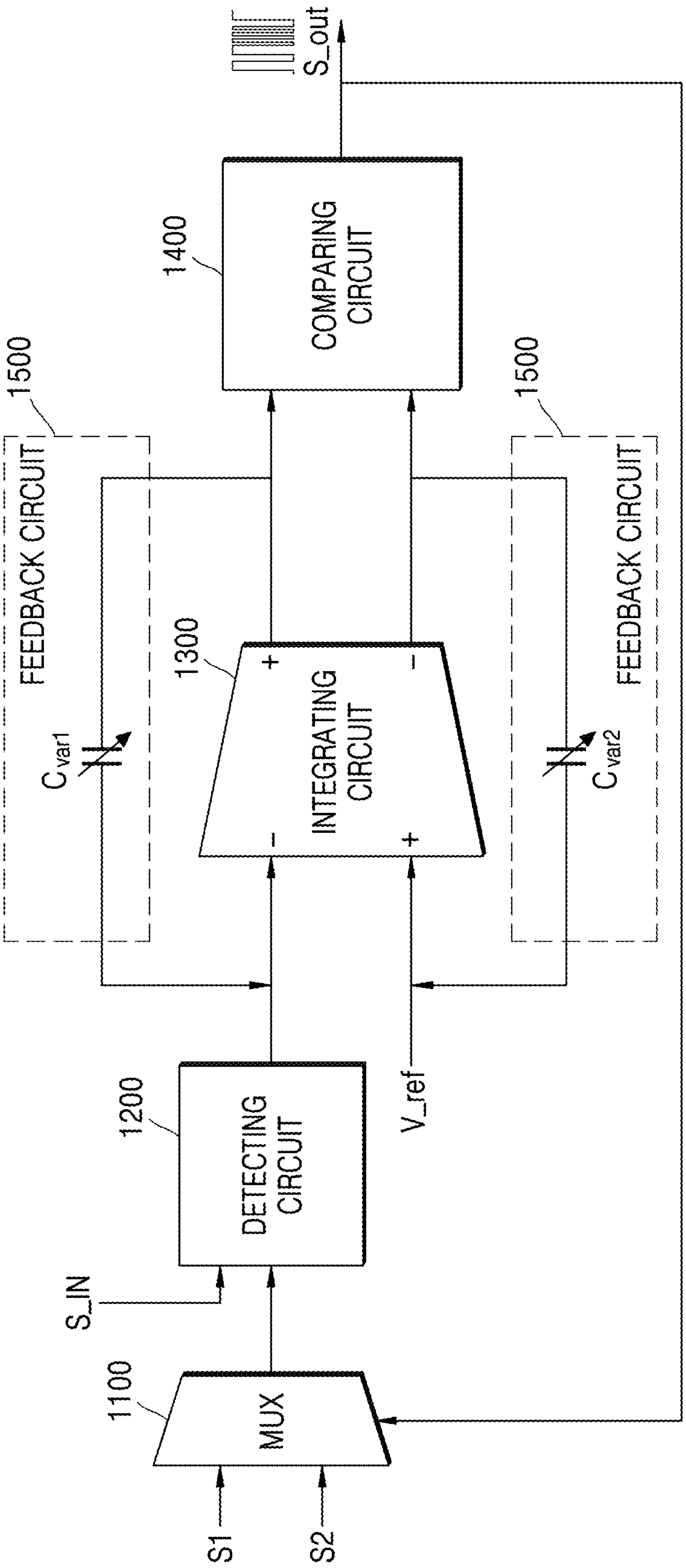
FIG. 11 is a circuit diagram illustrating a jitter measurement circuit according to an embodiment.

FIG. 11 is a circuit diagram illustrating a jitter measurement circuit according to an embodiment.

Referring to FIGS. 1 and 11, the jitter measurement circuit 1000 may include a multiplexer 1100, a detecting circuit 1200, an integrating circuit 1300, a comparing circuit 1400, and a feedback circuit 1500. The multiplexer 1100 may correspond to the multiplexer 100 of FIG. 1, the detecting circuit 1200 may correspond to the detecting circuit 200 of FIG. 1, the integrating circuit 1300 may correspond to the integrating circuit 300 of FIG. 1, the comparing circuit 1400 may correspond to the comparator 400 of FIG. 1, and the feedback circuit 1500 may correspond to the feedback circuit 500 of FIG. 1. Redundant descriptions of the configuration and operation of the jitter measurement circuit 1000 will be omitted.

The multiplexer 1100 may select a first comparison signal S1 or a second comparison signal S2 and provide the selected signal to the detecting circuit 1200, and the detecting circuit 1200 may detect a phase difference between an input signal S_IN and the output of the multiplexer 1100 and provide the detected phase difference to the integrating circuit 1300. For example, the output of the detecting circuit 1200 may be provided to a first input terminal (for example, a negative (−) input terminal) of the integrating circuit 1300. The integrating circuit 1300 may receive a reference potential V_ref through a second input terminal (e.g., a positive (+) input terminal), and accordingly, a differential signal generated by the integrating circuit 1300 may have a magnitude obtained by amplifying a difference between the output of the detecting circuit 1200 and the reference potential V_ref. The comparing circuit 1400 may receive the differential signal from the integrating circuit 1300, and may generate an output signal S_out according to a sign of the differential signal. The output signal S_out may be provided to the multiplexer 1100. For example, the output signal S_out may be fed back to the multiplexer 1100.

The feedback circuit 1500 may generate a feedback signal by trimming the amplified differential signal. As described above, the feedback circuit 1500 may adjust (e.g., expand the range and/or increase the maximum frequency) the measurable frequency range for jitter of the jitter measurement circuit 1000 by trimming the outputs of the integrating circuit 1300 and providing the trimmed results back to the input terminals of the integrating circuit 1300. The feedback circuit 1500 may include a first variable capacitor $C_{var1}$ and a second variable capacitor $C_{var2}$ to trim the outputs of the integrating circuit 1300. In some embodiments, the first variable capacitor $C_{var1}$ may be connected between the first output terminal and the first input terminal of the integrating circuit 1300. The first output terminal of the integrating circuit 1300 may be a positive (+) output terminal. For example, the first variable capacitor $C_{var1}$ may generate a feedback signal by trimming the differential signal output via the first output terminal of the integrating circuit 1300, and may be connected to the first input terminal of the integrating circuit 1300 so that the feedback signal is added to the output of the detecting circuit 1200. Likewise, the second variable capacitor $C_{var2}$ may be connected between the second output terminal and the second input terminal of the integrating circuit 1300. The second output terminal of the integrating circuit 1300 may be a negative (−) output terminal. Thus, for example, the second variable capacitor $C_{var2}$ may generate a feedback signal by trimming the differential signal output via the second output terminal of the integrating circuit 1300, and the feedback signal may be provided to the second input terminal of the integrating circuit 1300. As described above, the jitter measurement circuit according to an embodiment may adjust the jitter measurement frequency through a feedback loop for a differential signal, and may efficiently perform a test operation without requiring separate equipment.

Figure 12:
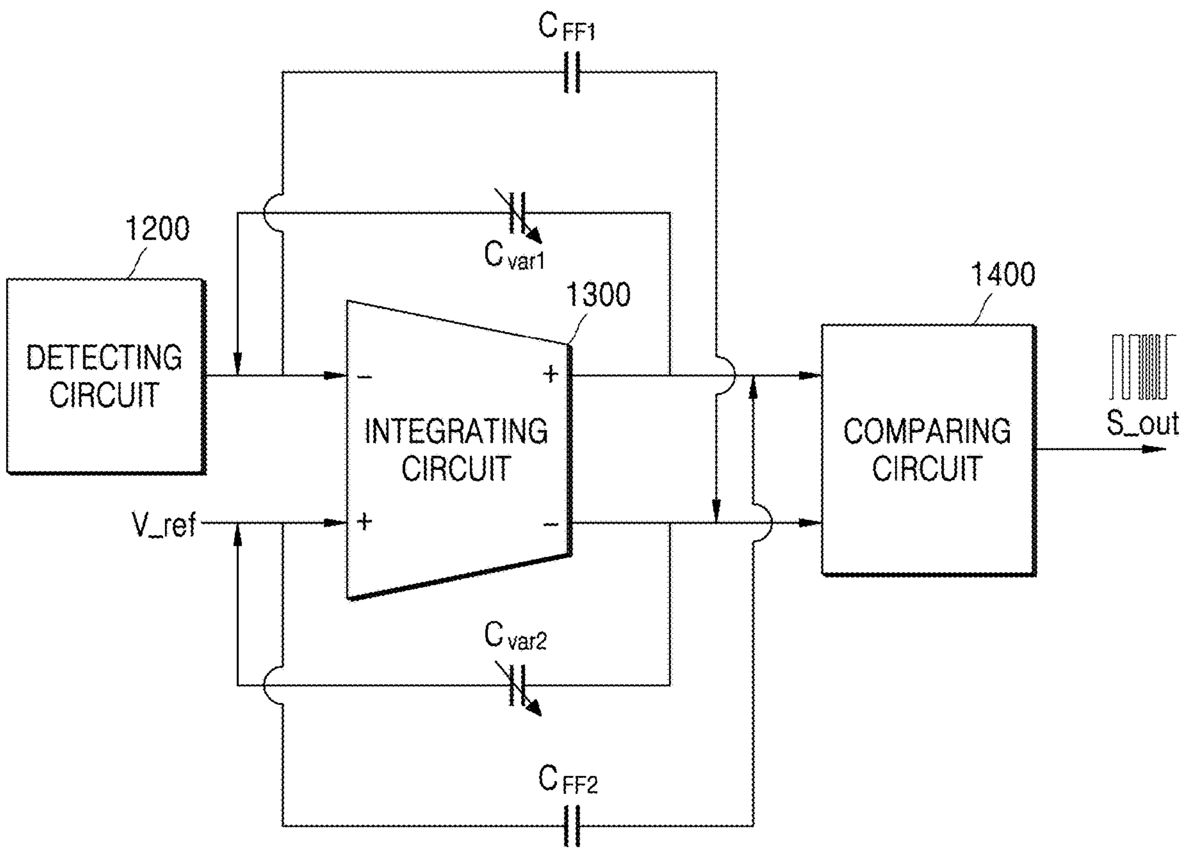
FIG. 12 is a circuit diagram illustrating a jitter measurement circuit with a feedforward structure according to an embodiment.

FIG. 12 is a circuit diagram illustrating a jitter measurement circuit to which a feedforward structure is applied according to an embodiment.

Referring to FIGS. 4 and 12, a jitter measurement circuit according to an embodiment may have a feedforward structure. A first feedforward capacitor $C_{FF1}$ may be connected between a first input terminal and a second output terminal of an integrating circuit 1300. The output of the detecting circuit 1200 and the feedback signal provided by the first variable capacitor $C_{var1}$ may be summed and provided to the second output terminal of the integrating circuit 1300 through the first feedforward capacitor $C_{FF1}$. For example, an adder may be provided between the detecting circuit 1200 and the first input terminal of the integrating circuit 1300. In this case, the comparing circuit 1400 may receive, as one input, a signal obtained by summing the output of the second output terminal of the integrating circuit 1300 and the output of the first feedforward capacitor $C_{FF1}$. An adder may also be provided between the second output terminal of the integrating circuit 1300 and the comparing circuit 1400. A second feedforward capacitor $C_{FF2}$ may be connected between the second input terminal and the first output terminal of the integrating circuit 1300. The feedback signal provided by the second variable capacitor $C_{var2}$ may be summed with a reference signal V_ref and provided to the first output terminal of the integrating circuit 1300 through the second feedforward capacitor $C_{FF2}$. For example, an adder may be provided at the second input terminal of the integrating circuit 1300. In this case, the comparing circuit 1400 may receive, the other input, a signal obtained by summing the output of the first output terminal of the integrating circuit 1300 and the output of the second feed forward capacitor $C_{FF2}$. An adder may also be provided between the first output terminal of the integrating circuit 1300 and the comparing circuit 1400. The comparing circuit 1400 may receive the feed-forwarded differential signals and generate an output signal S_out by comparing the two feed-forwarded signals.

Figure 13:
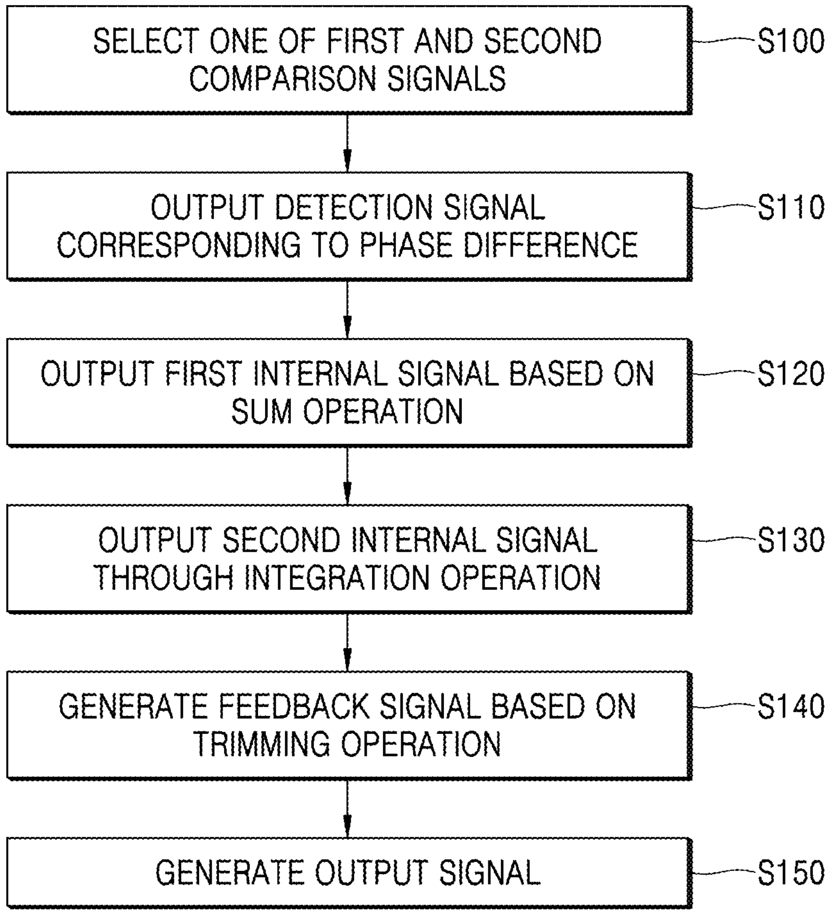
FIG. 13 is a flowchart illustrating a jitter measurement method according to an embodiment.

FIG. 13 is a flowchart illustrating a jitter measurement method according to an embodiment.

Referring to FIGS. 1 and 13, the jitter measurement method of measuring jitter may include a plurality of operations S100, S110, S120, S130, S140, and S150 as shown in FIG. 13. In some embodiments, the method of FIG. 13 may be a method performed by the jitter measurement circuit 10 of FIG. 1, and hereinafter, FIG. 13 will be described with reference to FIG. 1.

In operation S100, an operation of selecting one of the first comparison signal S1 and the second comparison signal S2 may be performed. For example, the multiplexer 100 may multiplex the first comparison signal S1 and the second comparison signal S2, which are clock signals including timing information, based on the output signal S_out. The multiplexer 100 may output a signal to be compared with the input signal S_IN through a multiplexing operation.

In operation S110, the detecting circuit 200 may output a detection signal by detecting a phase difference between signals. The detection signal may correspond to the phase difference. The input signal S_IN may be a signal including a noise component or the like. For example, the detecting circuit 200 may detect a phase difference between the signal selected by the multiplexer 100 and the input signal S_IN, and the detecting circuit 200 may output a detection signal (e.g., a voltage representing the phase difference) corresponding to the phase difference.

In operation S120, the first adder 250 may sum the output of the detecting circuit 200 and the feedback signal S_FB and output the result of the summing as a first internal signal. The output of the first adder 250 may be referred to as the first internal signal. As described above, the feedback signal S_FB may be a signal trimmed by the feedback circuit 500, and the first adder 250 provides, to the integrating circuit 300, a first internal signal obtained by summing the detection signal and the feedback signal S_FB, so that the frequency region in which the jitter is measured may be adjusted.

In operation S130, the integrating circuit 300 may receive the first internal signal, in other words, the output of the first adder 250, and perform an integration operation, and output a second internal signal as an integration result. By performing the integration operation on the first internal signal, noise shaping can be applied to a noise component or an error component. The second internal signal may be provided to the feedback circuit 500 and/or the comparator 400.

In operation S140, the feedback circuit 500 may generate the feedback signal S_FB by receiving and trimming the second internal signal, in other words, the output of the integrating circuit 300. The feedback signal S_FB may be provided to the first adder 250. A trimming operation may be performed by appropriately setting the feedback circuit 500 according to a specific configuration of the integrating circuit 300, and thus, a frequency region capable of measuring jitter may be adjusted.

In operation S150, the reference potential V_ref and the second internal signal, in other words, the output of the integrating circuit 300 may be compared with each other to generate an output signal S_out. The comparator 400 may compare the second internal signal, which is an analog signal, with the reference potential V_ref and output a logic high level or a logic low level according to the result, thereby outputting the comparison result as a digital signal. The output signal S_out may be provided to the multiplexer 100.

Figure 14:
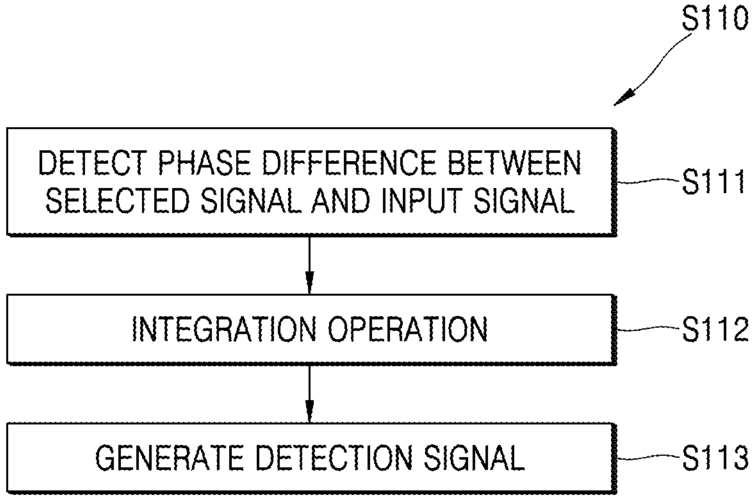
FIG. 14 is a flowchart illustrating a process of detecting a phase difference according to an embodiment.

FIG. 14 is a flowchart illustrating a process of detecting a phase difference according to an embodiment.

Referring to FIGS. 2 and 14, operation S110 of comparing the selected signal with the input signal S_IN to output a detection signal may include a plurality of operations S111, S112, and S113. In some embodiments, the method of FIG. 14 may be a method performed by the detecting circuit 200 of FIG. 2, and hereinafter, FIG. 14 will be described with reference to FIG. 2.

In operation S111, the phase frequency detector 210 may receive an input signal S_IN and a signal selected by the multiplexer 100. The phase frequency detector 210 may detect a phase difference therebetween by comparing the input signal S_IN, which includes a noise component with, the selected signal.

In operation S112, the phase frequency detector 210 may output a signal for controlling the charge pump 220 to generate charges corresponding to the phase difference, and the charge pump 220 may generate charges and provide the generated charges to the first integrator 230. The first integrator 230 may integrate charges supplied from the charge pump 220. For example, the first integrator 230 may perform an integration operation by charging or discharging the received charges to or from the capacitor.

In operation S113, the first integrator 230 may output a detection signal S_det corresponding to the phase difference based on the integration operation. For example, the detection signal S_det may be a signal in which information about a phase difference between the input signal S_IN and the selected signal is expressed in voltage.

Figure 15:
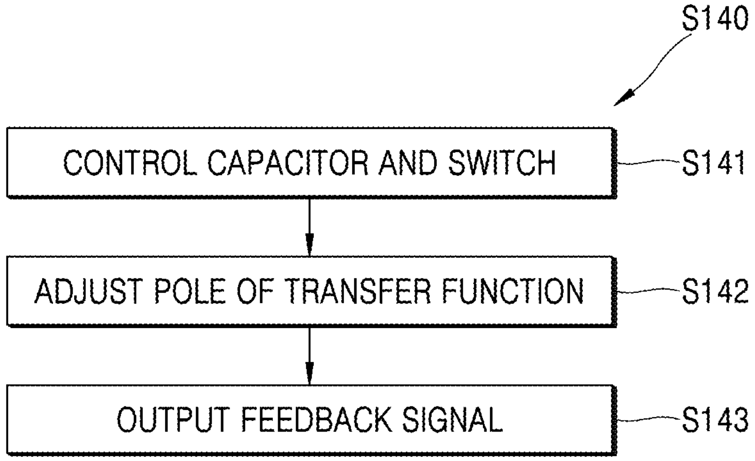
FIG. 15 is a flowchart for describing a trimming process according to an embodiment.

FIG. 15 is a flowchart for describing a trimming process according to an embodiment.

Referring to FIG. 15, the operation S140 of generating a feedback signal S_FB through a trimming operation may include a plurality of operations S141, S142, and S143. In some embodiments, the method of FIG. 15 may be a method performed by the feedback circuit 500 of FIGS. 1 and 8A, and hereinafter, FIG. 15 will be described with reference to FIG. 8A. However, as described above, the operation of generating the feedback signal S_FB through the trimming operation is not limited to the embodiment of FIG. 8A, and the configuration of capacitors included in the feedback circuit 500 and the method of controlling the equivalent capacitance may be implemented in various ways.

In operation S141, the feedback circuit 500 may control a capacitor and a switch included in the feedback circuit 500 based on a received control signal (e.g., a switching signal). For example, switches may be connected in series and/or parallel to the capacitor, and the switches may be turned on or off depending on the switching signal.

In operation S142, the feedback circuit 500 may control the capacitor and the switch to adjust the pole of the transfer function of the jitter measurement circuit 10 as described above. For example, the first switch SW1 may be turned on and the second switch SW2 may be turned off, based on the switching signals, and the equivalent capacitance of the feedback circuit 500 may be the sum of the capacitance of the first capacitor $C_1$ and the capacitance of the second capacitor $C_2$. When the first switch SW1 is turned off and the second switch SW2 is turned on, based thereon, the equivalent capacitance of the feedback circuit 500 may become the capacitance of the first capacitor$_{C1}$.

In operation S143, the feedback circuit 500 may output the second internal signal whose pole is adjusted, in other words, the trimmed second internal signal as the feedback signal S_FB, and adjust the jitter measurement frequency by providing the feedback signal S_FB as an input to the integration operation again.

As a result, the jitter measurement method according to the embodiment may variously adjust the frequency region for measuring jitter by controlling the connection relationship between capacitors through a switching operation and implementing the equivalent capacitance of the feedback circuit 500 in various ways.

Figure 16:
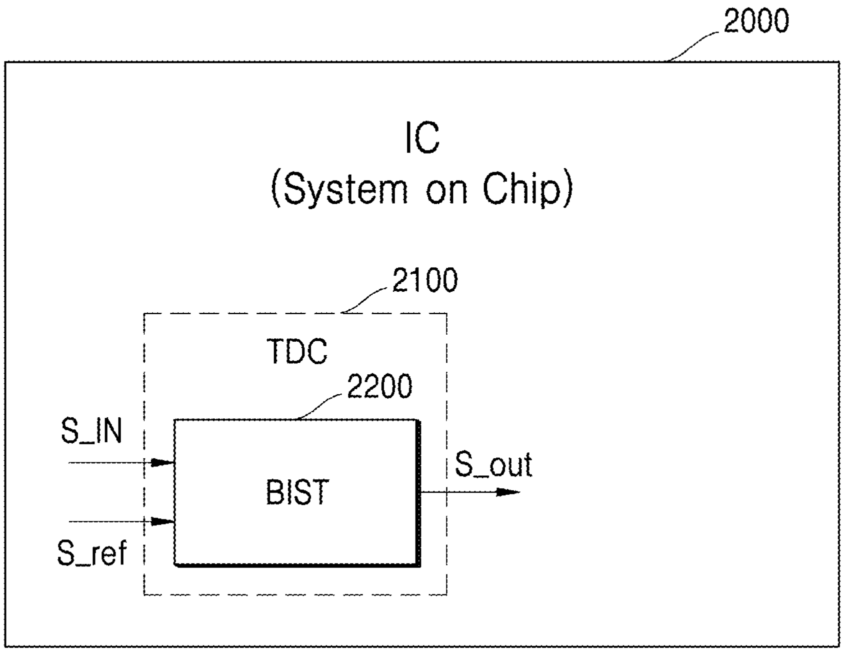
FIG. 16 is a block diagram illustrating a self-test operation according to an embodiment.

FIG. 16 is a block diagram illustrating a self-test operation according to an embodiment.

Referring to FIG. 16, an Integrated Circuit (IC) (or System on Chip (SoC)) 2000 according to an embodiment may include a built-in-self-test (BIST) circuit 2200. The BIST circuit 2200 may be a test circuit for jitter measurement implemented in the IC 2000. In some embodiments, the BIST circuit 2200 may be a circuit including the jitter measurement circuit 10 of FIG. 1.

In some embodiments, the BIST circuit 2200 may be implemented in a time-to-digital circuit (TDC) 2100 as illustrated. The TDC 2100 may be a circuit that performs a function of converting a time, in other words, a phase difference into a digital value, and the BIST circuit 2200 according to an embodiment may be a test circuit designed using the TDC 2100. However, this is merely an example, and the BIST circuit 2200 may be implemented by utilizing other circuits in the IC 2000, or may be implemented as a separate test circuit, and is not limited to being implemented within the TDC 2100.

The BIST circuit 2200 may receive a reference signal S_ref and an input signal S_IN including a noise component. The BIST circuit 2200 may output a phase difference between these signals as a digital signal, and may detect a jitter component included in the input signal S_IN based on the output signal S_out, which is a digital signal. The BIST circuit 2200 may adjust a frequency region used to detect the jitter component by using an internal feedback circuit (or trimming circuit) in the process of outputting a phase difference between signals as a digital signal. For example, the desired measurement frequency region may be set by appropriately designing the feedback circuit inside the BIST circuit 2200 and adjusting the feedback coefficient of the feedback circuit according to the configuration of the integrator(s) for converting the phase difference into a digital signal. In addition, the feedback circuit (or trimming circuit) inside the BIST circuit 2200 may be composed of a variable circuit, and the measurement frequency range may be adjusted by modifying the feedback circuit appropriately depending on a particular situation.

In other words, the IC 2000 including the BIST circuit 2200 according to the embodiment may measure the jitter component of the signal without having to employ a complicated test circuit design or test equipment due to the BIST circuit 2200. In addition, the BIST circuit 2200 according to an embodiment may control an internal circuit to variously adjust a frequency region capable of detecting a jitter component.

While the inventive concept has been particularly shown and described with reference to embodiments thereof, it will be understood that various changes in form and detail may be made thereto without departing from the spirit and scope of the inventive concept as set forth in the following claims.

What is claimed is:

1. A jitter measurement circuit for measuring a jitter of an input signal, the jitter measurement circuit comprising:

a multiplexer configured to output a first comparison signal or a second comparison signal in response to an output signal;

a detecting circuit configured to output a detection signal corresponding to a phase difference between an output of the multiplexer and the input signal;

a first adder configured to sum the detection signal and a feedback signal;

an integrating circuit configured to integrate and output an output of the first adder;

a feedback circuit configured to trim an output of the integrating circuit to generate the feedback signal; and a comparator configured to generate an output signal by comparing the output of the integrating circuit with a reference potential.

2. The jitter measurement circuit of claim 1, wherein the detecting circuit comprises:

a detector configured to detect a phase difference between an output of the multiplexer and the input signal; and a charge pump configured to generate a current corresponding to an output of the detector.

3. The jitter measurement circuit of claim 2, wherein the detecting circuit comprises a first integrator configured to output the detection signal based on a voltage corresponding to the phase difference by integrating the current.

4. The jitter measurement circuit of claim 1, wherein the integrating circuit comprises a second integrator and a third integrator, wherein the second integrator is configured to integrate the output of the first adder and provide an output corresponding to the integration of the output of the first adder to the third integrator, and the third integrator is configured to integrate and output the output of the second integrator.

5. The jitter measurement circuit of claim 1, further comprising a second adder configured to sum an output of the first adder and an output of the integrating circuit and provide a result of the summing to the comparator.

6. The jitter measurement circuit of claim 4, further comprising a second adder configured to sum an output of the first adder, an output of the second integrator, and an output of the third integrator to provide a result of the summing to the comparator.

7. The jitter measurement circuit of claim 1, wherein the first comparison signal has a phase obtained by adding a phase value to a reference signal, and the second comparison signal has a phase obtained by subtracting the phase value from the reference signal.

8. The jitter measurement circuit of claim 7, wherein the multiplexer is configured to:

output the first comparison signal in response to the output signal being at a logic high level; and output the second comparison signal in response to the output signal being at a logic low level.

9. The jitter measurement circuit of claim 1, wherein the feedback circuit is configured to provide an adjustable capacitance.

10. The jitter measurement circuit of claim 9, wherein the feedback circuit comprises:

a first capacitor and a second capacitor connected in parallel to each other;

a first switch connected in series with the second capacitor and configured to receive a first switching signal; and a second switch connected in parallel with the second capacitor and configured to receive a second switching signal.

11. The jitter measurement circuit of claim 10, wherein the feedback circuit comprises:

a third capacitor connected in parallel to the first capacitor;

a third switch connected in series with the third capacitor and configured to receive a third switching signal; and a fourth switch connected in parallel with the third capacitor and configured to receive a fourth switching signal, wherein the first switching signal and the second switching signal are complementary to each other, and the third switching signal and the fourth switching signal are complementary to each other.

12. A jitter measurement circuit for measuring a jitter of an input signal, the jitter measurement circuit comprising:

a multiplexer configured to select and output one of a first comparison signal and a second comparison signal based on an output signal;

a detecting circuit configured to output a detection signal corresponding to a phase difference between an output of the multiplexer and the input signal;

an integrating circuit including a first input terminal connected to the detecting circuit, a second input terminal, a first output terminal and a second output terminal, and configured to amplify signals received through the first input terminal and the second input terminal and output amplified signals to the first output terminal and the second output terminal;

a feedback circuit including a first variable capacitor connected between the first output terminal and the first input terminal and a second variable capacitor connected between the second output terminal and the second input terminal; and a comparing circuit configured to compare the signal output to the first output terminal and the signal output to the second output terminal with a reference potential to output the output signal based on a result of the comparison.

13. The jitter measurement circuit of claim 12, further comprising:

a first feedforward capacitor connected between the second output terminal and the first input terminal; and a second feedforward capacitor connected between the first output terminal and the second input terminal.

14. The jitter measurement circuit of claim 12, wherein the detecting circuit comprises:

a detector configured to output a first switching signal and a second switching signal by detecting a phase difference between the output of the multiplexer and the input signal; and a charge pump comprising a first current source connected in series to a first current switch configured to operate based on the first switching signal and a second current source connected in series to a second current switch configured to operate based on the second switching signal.

15. The jitter measurement circuit of claim 12, wherein each of the first variable capacitor and the second variable capacitor comprises:

a first capacitor; and a second capacitor connected in parallel with the first capacitor, wherein the second capacitor is connected in series with a first switch and is connected in parallel with a second switch.

16. The jitter measurement circuit of claim 15, wherein the first switch and the second switch are configured to operate complementarily to each other.

17. A jitter measurement method of measuring a jitter of an input signal, the jitter measurement method comprising:

selecting one of a first comparison signal and a second comparison signal, which are clock signals, in response to an output signal;

outputting a detection signal corresponding to a phase difference between the input signal and the selected one of the first comparison signal and the second comparison signal;

outputting a first internal signal by summing the detection signal and a feedback signal;

outputting a second internal signal by integrating the first internal signal;

generating the feedback signal by trimming the second internal signal; and generating the output signal by comparing the second internal signal with a reference potential.

18. The jitter measurement method of claim 17, further comprising outputting a third internal signal by summing the first internal signal and the second internal signal, wherein the generating of the output signal comprises comparing the third internal signal with the reference potential.

19. The jitter measurement method of claim 17, wherein the outputting of the detection signal comprises:

detecting the phase difference between the selected signal and the input signal; and outputting the detection signal based on an integration operation.

20. The jitter measurement method of claim 17, wherein the generating of the feedback signal comprises:

adjusting a pole of a transfer function based on a variable capacitor and a switch; and outputting the feedback signal.

* * * * *